(12) United States Patent
Lovicott et al.

(10) Patent No.: US 10,153,225 B1
(45) Date of Patent: Dec. 11, 2018

(54) SYSTEMS AND METHODS FOR OPTIMIZING INFORMATION HANDLING SYSTEM COMPONENT TEMPERATURE FOR PERFORMANCE

(71) Applicant: Dell Products L.P., Round Rock, TX (US)

(72) Inventors: Dominick A. Lovicott, Jarrell, TX (US); Mukund P. Khatri, Austin, TX (US); Robert B. Curtis, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/614,259

(22) Filed: Jun. 5, 2017

(51) Int. Cl.
| | |
|---|---|
| *H01L 23/467* | (2006.01) |
| *H05K 7/20* | (2006.01) |
| *G11B 33/14* | (2006.01) |
| *G06F 1/20* | (2006.01) |

(52) U.S. Cl.
CPC ....... *H01L 23/467* (2013.01); *H05K 7/20736* (2013.01); *G06F 1/206* (2013.01); *G11B 33/142* (2013.01)

(58) Field of Classification Search
CPC ..... G06F 1/1658; G06F 1/187; G11B 33/142; G11B 33/124–33/125; H01L 23/467; H01L 2924/002; G01K 1/026; G01K 7/42
USPC .................. 361/692; 340/584, 635; 348/748; 353/52, 57; 352/198, 202; 700/282, 700/299–300
See application file for complete search history.

(56) References Cited

U.S. PATENT DOCUMENTS

| | | | | |
|---|---|---|---|---|
| 5,492,082 A * | 2/1996 | Krevinghaus | ........ | A01K 1/0047 119/437 |
| 6,014,611 A * | 1/2000 | Arai | ........ | G06F 1/206 702/132 |
| 2009/0294107 A1* | 12/2009 | Nishiyama | ........ | G06F 1/187 165/104.34 |
| 2010/0053879 A1* | 3/2010 | Miyamoto | ........ | G11B 33/128 361/679.31 |
| 2014/0117906 A1* | 5/2014 | Busch | ........ | H02P 1/04 318/471 |
| 2015/0257310 A1* | 9/2015 | DeSouza | ........ | H05K 7/20836 361/679.46 |
| 2016/0233639 A1* | 8/2016 | Sato | ........ | H01S 3/0407 |
| 2016/0266560 A1* | 9/2016 | Chou | ........ | G05B 19/042 |
| 2017/0102160 A1* | 4/2017 | Conklin | ........ | F24F 11/0076 |
| 2017/0160771 A1* | 6/2017 | Albrecht | ........ | G06F 1/20 |

* cited by examiner

*Primary Examiner* — Dion R Ferguson
*Assistant Examiner* — Amir Jalali
(74) *Attorney, Agent, or Firm* — Jackson Walker L.L.P.

(57) ABSTRACT

In accordance with embodiments of the present disclosure, an information handling system may include a plurality of information handling resources and a thermal control system comprising a plurality of air movers, wherein the thermal control system is configured to operate in a first cooling mode in which the thermal control system operates at least one first air mover of the plurality of air movers to maintain a first information handling resource of the plurality of information handling resources above a minimum temperature threshold and operates at least one second air mover of the plurality of air movers to maintain a second information handling resource of the plurality of information handling resources below a maximum temperature threshold.

15 Claims, 3 Drawing Sheets

SYSTEMS AND METHODS FOR OPTIMIZING INFORMATION HANDLING SYSTEM COMPONENT TEMPERATURE FOR PERFORMANCE

TECHNICAL FIELD

The present disclosure relates in general to information handling systems, and more particularly to optimizing information handling system component temperature for performance.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

In most cases the goal of thermal controls is to maintain component temperature of an information handling resource below a specific threshold. This threshold is typically based on reliability, safety, or throughput requirements of the information handling resource. However, there are cases where operating an information handling resource below a certain temperature can negatively impact performance. For example, in some processors, below a certain temperature, a stack up of voltage tolerances in excess of their limits may occur and result in the processor operating below its maximum frequency.

According, it may be beneficial to operate certain information handling resources closer to their temperature limits to achieve better power efficiency, but oftentimes one or more other information handling resources in an information handling system may drive fan speeds which may result in overcooling of other components. At the same time, it may be desired to prevent an information handling resource from exceeding its limits to intentionally heat or throttle another information handling resource as this may prove counterproductive.

SUMMARY

In accordance with the teachings of the present disclosure, disadvantages and problems associated with thermal control of an information handling system may be reduced or eliminated.

In accordance with embodiments of the present disclosure, an information handling system may include a plurality of information handling resources and a thermal control system comprising a plurality of air movers, wherein the thermal control system is configured to operate in a first cooling mode in which the thermal control system operates at least one first air mover of the plurality of air movers to maintain a first information handling resource of the plurality of information handling resources above a minimum temperature threshold and operates at least one second air mover of the plurality of air movers to maintain a second information handling resource of the plurality of information handling resources below a maximum temperature threshold.

In accordance with these and other embodiments of the present disclosure, a method comprises operating a thermal control system of an information handling system in a first cooling mode, wherein operating the thermal control system in the first cooling mode comprises operating at least one first air mover of a plurality of air movers to maintain a first information handling resource of a plurality of information handling resources above a minimum temperature threshold and operating at least one second air mover of the plurality of air movers to maintain a second information handling resource of the plurality of information handling resources below a maximum temperature threshold.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to operate a thermal control system of an information handling system in a first cooling mode, wherein operating the thermal control system in the first cooling mode comprises operating at least one first air mover of the plurality of air movers to maintain a first information handling resource of a plurality of information handling resources above a minimum temperature threshold and operating at least one second air mover of the plurality of air movers to maintain a second information handling resource of the plurality of information handling resources below a maximum temperature threshold.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
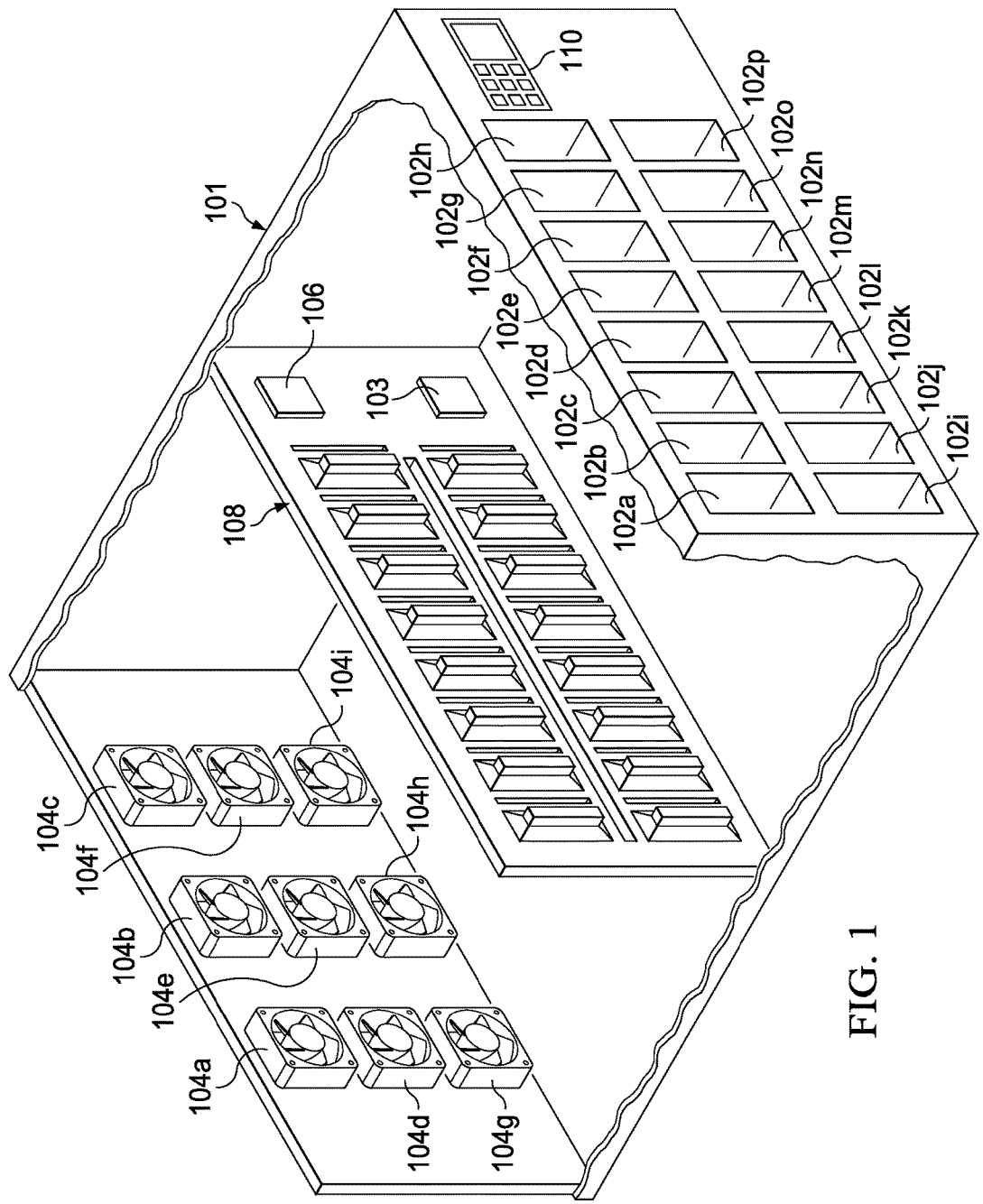
FIG. 1 illustrates a block diagram of an example information handling system, in accordance with embodiments of the present disclosure.

FIG. 1 illustrates a block diagram of an example system having an example information handling system 101 with a plurality of slots 102a-p (sometimes referred to individually as a slot 102 or in plural as slots 102) electrically and mechanically coupled to a midplane 108, wherein each slot 102 may be configured to receive a modular information handling resource (e.g., a storage drive). For purposes of descriptive clarity, although FIG. 1 depicts information handling system 101 as having 16 slots 102, information handling system 101 may include any suitable number of slots 102. As depicted in FIG. 1, information handling system may also include a processor 103 electrically and mechanically coupled to midplane 108, a management controller 106 electrically and mechanically coupled to processor 103 and midplane 108, a plurality of air movers 104a-104i (sometimes referred to individually as an air mover 104 or in plural as air movers 104) communicatively coupled to management controller 106, and a user interface 110 communicatively coupled to management controller 106.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a memory (not explicitly shown in FIG. 1 for purposes of illustrative clarity) and/or another component of information handling system 101.

An air mover 104 may be communicatively coupled to management controller 106, and may include any mechanical or electro-mechanical system, apparatus, or device operable to move air and/or other gases. In some embodiments, an air mover 104 may comprise a fan (e.g., a rotating arrangement of vanes or blades which act on the air). In other embodiments, an air mover 104 may comprise a blower (e.g., a centrifugal fan that employs rotating impellers to accelerate air received at its intake and change the direction of the airflow). In these and other embodiments, rotating and other moving components of an air mover 104 may be driven by a motor. The rotational speed of such motor may be controlled by one or more control signals communicated from management controller 106. In operation, an air mover 104 may cool information handling systems and information handling resources of information handling system 101 by drawing cool air into information handling system 101 from outside information handling system 101, expelling warm air from inside information handling system 101 to the outside of chassis, and/or moving air across one or more heatsinks (not explicitly shown) internal to information handling system 101 to cool one or more information handling systems and/or information handling resources. Although FIG. 1 depicts information handling system 101 as having nine air movers 104, information handling system 101 may include any suitable number of air movers 104.

Management controller 106 may comprise any system, device, or apparatus configured to facilitate management and/or control of components of information handling system 101, information handling systems modularly coupled within, and/or one or more of its component information handling resources. Management controller 106 may be configured to issue commands and/or other signals to manage and/or control information handling systems coupled to slots 102 and/or information handling resources of information handling system 101. Management controller 106 may comprise a microprocessor, microcontroller, DSP, ASIC, field programmable gate array ("FPGA"), EEPROM, or any combination thereof. As shown in FIG. 1, management controller 106 may be coupled to midplane 108. Accordingly, management controller 106 may be coupled to processor 103 via midplane 108.

In addition or alternatively, management controller 106 may also provide a management console for user/administrator access to these functions. For example, management controller 106 may provide for communication with a user interface (e.g., user interface 110), permitting a user to interact with management controller 106 and configure control and management of components of information handling system 101 by management controller 106. As another example, management controller 106 may implement Web Services Management ("WS-MAN") or another suitable management protocol permitting a user to remotely access a management controller 106 to configure information handling system 101 and its various information handling resources. In such embodiments, a management controller 106 may interface with a network interface separate from a traditional network interface of information handling system 101, thus allowing for "out-of-band" control of information handling system 101, such that communications to and from management controller 106 are communicated via a management channel physically isolated from an "in band" communication channel with the traditional network interface. Thus, for example, if a failure occurs in information handling system 101 that prevents an administrator from interfacing with information handling system 101 via a traditional network interface and/or user interface 110 (e.g., operating system failure, power failure, etc.), the administrator may still be able to monitor and/or manage information handling system 101 (e.g., to diagnose problems that may have caused failure) via management controller 106. In the same or alternative embodiments, management controller 106 may allow an administrator to remotely manage one or more parameters associated with operation of information handling system 101 and its various information handling resources (e.g., power usage, processor allocation, memory allocation, security privileges, cooling modes, etc.).

Midplane 108 may comprise any system, device, or apparatus configured to interconnect information handling resources of information handling system 101 with each other. Accordingly, midplane 108 may include slots, pads, and/or other connectors configured to receive corresponding electrical connectors of information handling resources in order to electrically couple information handling systems disposed in slots 102 and/or information handling resources to each other. For example, midplane 108 may comprise a printed circuit board.

User interface 110 may include any system, apparatus, or device via which a user may interact with information handling system 101 and its various components by facilitating input from a user allowing the user to manipulate information handling system 101 and output to a user allowing information handling system 101 to indicate effects of the user's manipulation. For example, user interface 110 may include a display suitable for creating graphic images and/or alphanumeric characters recognizable to a user, and may include, for example, a liquid crystal display, a cathode ray tube, a plasma screen, and/or a digital light processor projection monitor. In certain embodiments, such a display may be an integral part of information handling system 101 and receive power from power supplies (not explicitly shown) of information handling system 101, rather than being coupled to information handling system 101 via a cable. In some embodiments, such display may comprise a touch screen device capable of receiving user input, wherein a touch sensor may be mechanically coupled or overlaid upon the display and may comprise any system, apparatus, or device suitable for detecting the presence and/or location of a tactile touch, including, for example, a resistive sensor, capacitive sensor, surface acoustic wave sensor, projected capacitance sensor, infrared sensor, strain gauge sensor, optical imaging sensor, dispersive signal technology sensor, and/or acoustic pulse recognition sensor. In these and other embodiments, user interface 110 may include other user interface elements (e.g., a keypad, buttons, and/or switches placed in proximity to a display) allowing a user to provide input to information handling system 101. User interface 110 may be coupled to management controller 106 and/or other components of information handling system 101, and thus may allow a user to configure various information handling systems and/or information handling resources of information handling system 101 via a management console of management controller 106.

In addition to slots 102, processor 103, air movers 104, management controller 106, midplane 108, and user interface 110, information handling system 101 may include one or more other information handling resources.

In operation, management controller 106 may, based on on a selected cooling mode for information handling system 101, generate a map between air movers 104 and information handling resources of information handling system 101, and control each air mover 104 to operate to satisfy thermal operating conditions of information handling resources mapped to such air mover, as described in greater detail below.

Figure 2:
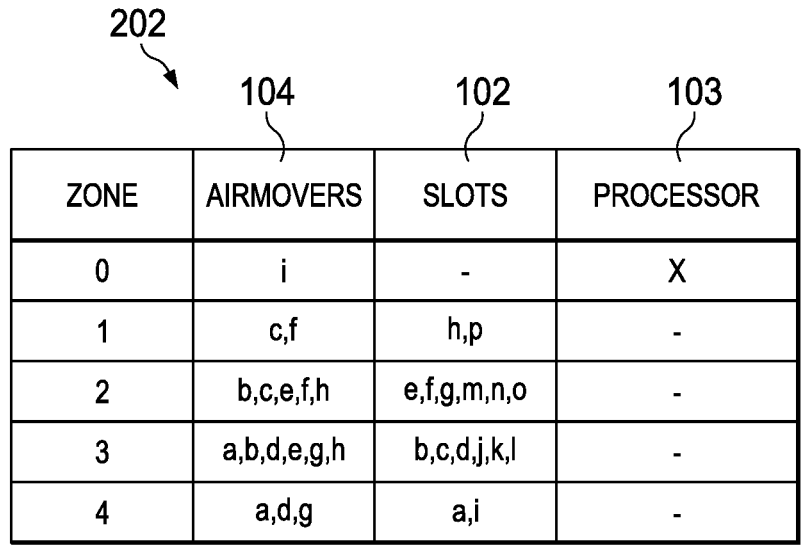
FIG. 2 illustrates an example table defining zones in a performance-enhanced cooling mode whereby particular air movers within the information handling system depicted in FIG. 1 are associated with information handling resources within the information handling system, in accordance with the present disclosure.

As an example of mapping of air movers 104 to information handling resources of information handling system 101 based on a selected cooling mode for information handling system 101, FIG. 2 illustrates an example table 202 defining zones in a performance-enhanced cooling mode whereby particular air movers 104 within information handling system 101 are associated with information handling resources within information handling system 101, in accordance with the present disclosure. Table 202 may include a table, database, map, list, or other data structure which associates air movers 104 to corresponding information handling resources (e.g., processor 103 and information handling resources inserted into particular slots 102). Thus, table 202 defines various cooling zones of information handling system 101, including the air movers 104 for thermally controlling particular information handling resources. For example, in the particular example shown in table 202, air mover 104*i* may be assigned to zone 0 which includes processor 103, and other zones 1-4 by which various air movers 104*a-h* may be assigned to information handling resources inserted into various slots 102. Accordingly, in such example, air mover 104*i* may be used to maintain processor 103 above a particular operating temperature in order to optimize performance of processor 103 while other air movers 104*a-h* may be used to maintain information handling resources inserted into slots 102 below their respective maximum operating temperatures.

However, in some instances, information handling system 101 may have a configuration that would prevent it from adequately cooling information handling resources of information handling system 101 below their respective maximum temperatures if operated in the performance-enhanced cooling mode depicted in table 202. For example, if one of air movers 104c or 104f were to be absent or experience a fault, the remaining air mover 104c or 104f in zone 1 may be incapable of adequately cooling information handling resources disposed in slots 102h and 102p. Accordingly, in such a scenario, air mover 104i may be needed in zone 1 to adequately provide the needed cooling of information handling resources within zone 1, and such operation of air mover 104i to provide adequate cooling of such information handling resources may not enable it to also maintain processor 103 above a particular desired temperature.

Figure 3:
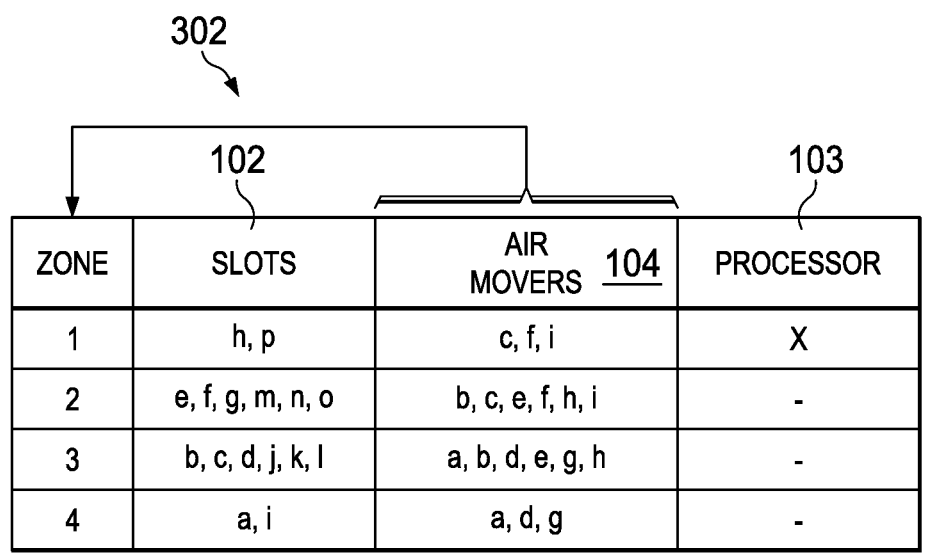
FIG. 3 illustrates an example table defining zones in a default cooling mode whereby particular air movers within the information handling system depicted in FIG. 1 are associated with information handling resources within the information handling system, in accordance with the present disclosure.

In this vein, FIG. 3 illustrates an example table defining zones in a default cooling mode whereby particular air movers 104 within information handling system 101 are associated with information handling resources within information handling system 101, in accordance with the present disclosure. Table 302 may include a table, database, map, list, or other data structure which associates air movers 104 to corresponding information handling resources (e.g., processor 103 and information handling resources inserted into particular slots 102). Thus, table 302 defines various cooling zones of information handling system 101, including the air movers 104 for thermally controlling particular information handling resources. For example, in the particular example shown in table 302, air movers 104c, 104f, and 104i may be assigned to zone 1 which includes processor 103, and information handling resources inserted into slots 102h and 102p, and other zones 2-4 by which various air movers 104a-i may be assigned to information handling resources inserted into various slots 102. Accordingly, in such example, rather than providing cooling exclusively to processor 103 as shown in table 202, in the default cooling mode of table 302, air mover 104i may be used along with air movers 104c and 104f to maintain information handling resources inserted into slots 102h and 102p below their respective maximum operating temperatures.

Figure 4:
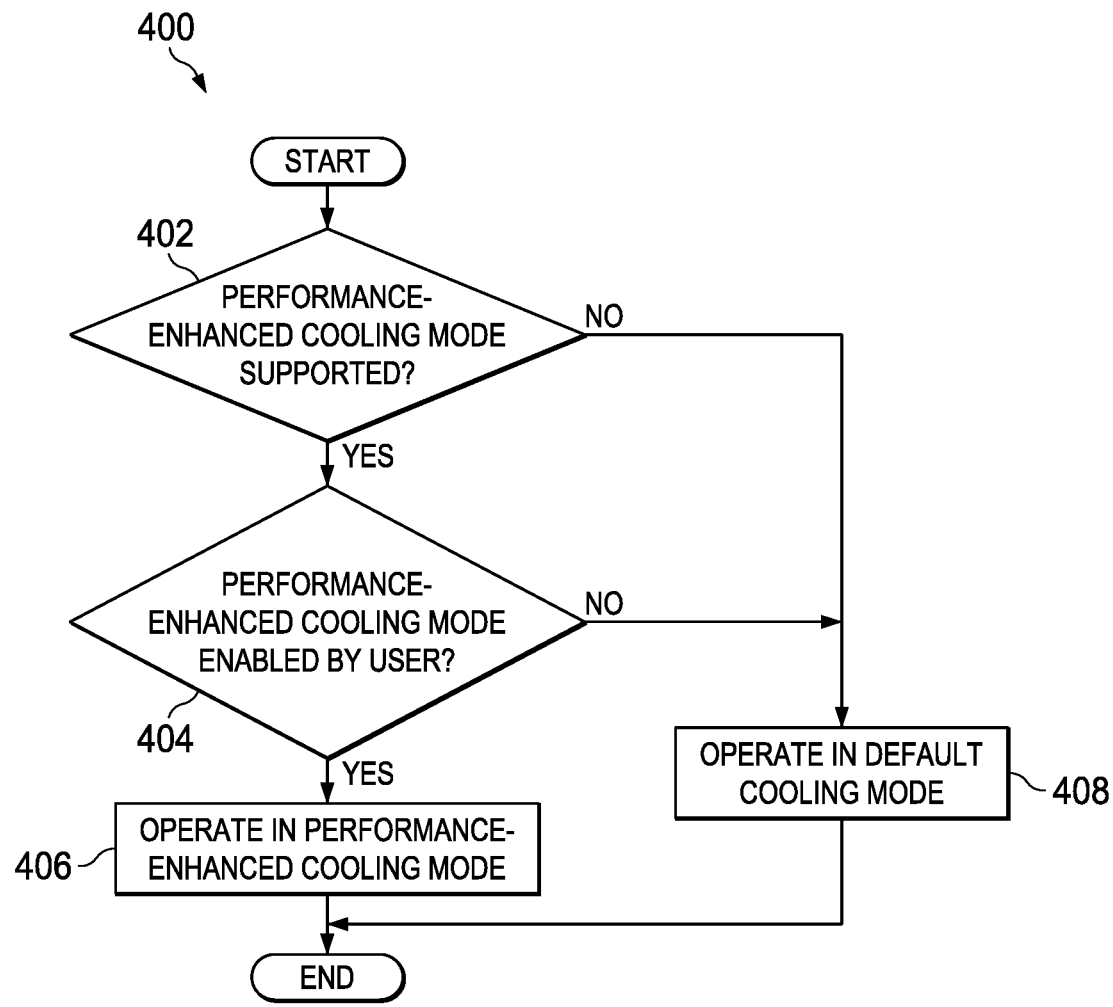
FIG. 4 illustrates a flow chart of an example method for optimizing an information handling resource component temperature for performance, in accordance with the present disclosure.

FIG. 4 illustrates a flow chart of an example method 400 for optimizing an information handling resource component temperature for performance, in accordance with the present disclosure. According to one embodiment, method 400 may begin at step 402. As noted above, teachings of the present disclosure may be implemented in a variety of configurations of information handling system 101. As such, the preferred initialization point for method 400 and the order of the steps comprising method 400 may depend on the implementation chosen.

Method 400 may be executed at any appropriate time. For example, method 400 may be executed upon a powering on, boot, or other initialization of information handling system 101. As another example, method 400 may be executed in response to a change in a configuration of information handling system 101 (e.g., insertion, removal, or fault of an air mover 104; insertion or removal of an information handling resource into/from a slot 102).

At step 402, management controller 106 may determine if a current configuration of information handling system 101 is capable of operating in the performance-enhanced cooling mode while also adequately cooling all information handling resources of information handling system 101. If the current configuration of information handling system 101 is capable of operating in the performance-enhanced cooling mode while also adequately cooling all information handling resources of information handling system 101, method 400 may proceed to step 404. Otherwise, method 400 may proceed to step 408.

At step 404, responsive to determining that the current configuration of information handling system 101 is capable of operating in the performance-enhanced cooling mode while also adequately cooling all information handling resources of information handling system 101, management controller 106 may determine if a user setting (e.g., a setting of an administrator or other user via user interface 110) is set for enabling or disabling operation in the performance-enhanced cooling mode. If the user setting is set for enabling operation in the performance-enhanced cooling mode, method 400 may proceed to step 406. Otherwise, if the user setting is set for disabling operation in the performance-enhanced cooling mode, method 400 may proceed to step 408.

At step 406, management controller 106 may cause a thermal control system of information handling system 101, including air movers 104, to operate in the performance-enhanced cooling mode (e.g., as shown in table 202) in which it operates at least one first air mover 104 to maintain a first information handling resource (e.g., processor 103) above a minimum temperature threshold and operates at least one second air mover 104 to maintain a second information handling resource below a maximum temperature threshold. After completion of step 406, method 400 may end.

At step 408, management controller 106 may cause a thermal control system of information handling system 101, including air movers 104, to operate in the default cooling mode (e.g., as shown in table 202) in which it operates the at least one first air mover 104 and the at least second air mover 104 to maintain the second information handling resource below the maximum temperature threshold. After completion of step 408, method 400 may end.

Although FIG. 4 discloses a particular number of steps to be taken with respect to method 400, method 400 may be executed with greater or lesser steps than those depicted in FIG. 4. In addition, although FIG. 4 discloses a certain order of steps to be taken with respect to method 400, the steps comprising method 400 may be completed in any suitable order.

Method 400 may be implemented using management controller 106 or any other system operable to implement method 400. In certain embodiments, method 400 may be implemented partially or fully in software and/or firmware embodied in computer-readable media.

Although the present disclosure has been described in detail, it should be understood that various changes, substitutions, and alterations can be made hereto without departing from the spirit and the scope of the disclosure as defined by the appended claims.

What is claimed is:

1. An information handling system comprising:
a plurality of information handling resources; and
a thermal control system comprising a plurality of air movers, wherein the thermal control system is configured to operate in a first cooling mode in which the thermal control system:
controls voltages associated with a first information handling resource of the plurality of information handling resources by operating at least one first air mover of the plurality of air movers to maintain the first information handling resource above a minimum temperature threshold, wherein maintaining the first information handling resource above the minimum temperature threshold is operable to prevent the voltages from exceeding a tolerance limit; and operates at least one second air mover of the plurality of air movers to maintain a second information handling resource of the plurality of information handling resources below a maximum temperature threshold.

2. The information handling system of claim 1, wherein the thermal control system is further configured to operate in a second cooling mode in which the thermal control system operates the at least one first air mover and the at least one second air mover to maintain the first information handling resource below the maximum temperature threshold.

3. The information handling system of claim 2, wherein the thermal control system is further configured to:
  determine if a current configuration of the information handling system is capable of operating in the first cooling mode while also maintaining the second information handling resource below the maximum temperature threshold and the first information handling resource below a corresponding maximum temperature threshold;
  operate in the first cooling mode responsive to determining that the current configuration of the information handling system is capable; and
  operate in the second cooling mode responsive to determining that the current configuration of the information handling system is incapable.

4. The information handling system of claim 2, wherein the thermal control system is further configured to:
  determine if a user setting is set to enable or disable operation in the first cooling mode;
  operate in the first cooling mode responsive to determining that the user setting is set to enable operation in the first cooling mode; and
  operate in the second cooling mode responsive to determining that the user setting is set to disable operation in the first cooling mode.

5. The information handling system of claim 1, wherein the first information handling resource comprises a processor.

6. A method comprising operating a thermal control system of an information handling system in a first cooling mode, wherein operating the thermal control system in the first cooling mode comprises:
  controlling voltages associated with a first information handling resource of a plurality of information handling resources by operating at least one first air mover of a plurality of air movers to maintain the first information handling resource above a minimum temperature threshold, wherein maintaining the first information handling resource above the minimum temperature threshold is operable to prevent the voltages from exceeding a tolerance limit; and
  operating at least one second air mover of the plurality of air movers to maintain a second information handling resource of the plurality of information handling resources below a maximum temperature threshold.

7. The method of claim 6, further comprising operating the thermal control system in a second cooling mode, wherein operating the thermal control system in the second cooling mode comprises operating the at least one first air mover and the at least one second air mover to maintain the second information handling resource below the maximum temperature threshold.

8. The method of claim 7, further comprising:
  determining if a current configuration of the information handling system is capable of operating in the first cooling mode while also maintaining the second information handling resource below the maximum temperature threshold and the first information handling resource below a corresponding maximum temperature threshold;
  operating in the first cooling mode responsive to determining that the current configuration of the information handling system is capable; and
  operating in the second cooling mode responsive to determining that the current configuration of the information handling system is incapable.

9. The method of claim 7, further comprising:
  determining if a user setting is set to enable or disable operation in the first cooling mode;
  operating in the first cooling mode responsive to determining that the user setting is set to enable operation in the first cooling mode; and
  operating in the second cooling mode responsive to determining that the user setting is set to disable operation in the first cooling mode.

10. The method of claim 6, wherein the first information handling resource comprises a processor.

11. An article of manufacture comprising:
  a non-transitory computer-readable medium; and
  computer-executable instructions carried on the computer-readable medium, the instructions readable by a processor, the instructions, when read and executed, for causing the processor to operate a thermal control system of an information handling system in a first cooling mode, wherein operating the thermal control system in the first cooling mode comprises:
    controlling voltages associated with a first information handling resource of a plurality of information handling resources by operating at least one first air mover of a plurality of air movers to maintain the first information handling resource above a minimum temperature threshold, wherein maintaining the first information handling resource above the minimum temperature threshold is operable to prevent the voltages from exceeding a tolerance limit; and
    operating at least one second air mover of the plurality of air movers to maintain a second information handling resource of the plurality of information handling resources below a maximum temperature threshold.

12. The article of claim 11, the instructions for further causing the processor to operate the thermal control system in a second cooling mode, wherein operating the thermal control system in the second cooling mode comprises operating the at least one first air mover and the at least one second air mover to maintain the second information handling resource below the maximum temperature threshold.

13. The article of claim 12, the instructions for further causing the processor to:
  determine if a current configuration of the information handling system is capable of operating in the first cooling mode while also maintaining the second information handling resource below the maximum temperature threshold and the first information handling resource below a corresponding maximum temperature threshold;
  operate in the first cooling mode responsive to determining that the current configuration of the information handling system is capable; and
  operate in the second cooling mode responsive to determining that the current configuration of the information handling system is incapable.

14. The article of claim 12, the instructions for further causing the processor to:
- determine if a user setting is set to enable or disable operation in the first cooling mode;
- operate in the first cooling mode responsive to determining that the user setting is set to enable operation in the first cooling mode; and
- operate in the second cooling mode responsive to determining that the user setting is set to disable operation in the first cooling mode.

15. The article of claim 11, wherein the first information handling resource comprises a second processor.

\* \* \* \* \*